(12) United States Patent
Modarres Razavi et al.

(10) Patent No.: US 10,890,665 B2
(45) Date of Patent: Jan. 12, 2021

(54) METHOD AND APPARATUS IN A GLOBAL NAVIGATION SYSTEM

(71) Applicant: Telefonaktiebolaget LM Ericsson (publ), Stockholm (SE)

(72) Inventors: Sara Modarres Razavi, Linköping (SE); Fredrik Gunnarsson, Linköping (SE); Henrik Rydén, Solna (SE); Xin Zhang, Unterhaching (DE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 193 days.

(21) Appl. No.: 16/079,145

(22) PCT Filed: Jun. 27, 2018

(86) PCT No.: PCT/SE2018/050695
§ 371 (c)(1),
(2) Date: Aug. 23, 2018

(87) PCT Pub. No.: WO2019/032004
PCT Pub. Date: Feb. 14, 2019

(65) Prior Publication Data
US 2020/0081130 A1    Mar. 12, 2020

Related U.S. Application Data

(60) Provisional application No. 62/544,237, filed on Aug. 11, 2017.

(51) Int. Cl.
*G01S 19/25*   (2010.01)
*G01R 19/02*   (2006.01)
(Continued)

(52) U.S. Cl.
CPC ............ *G01S 19/254* (2013.01); *G01R 19/02* (2013.01); *G01S 5/0036* (2013.01); *G01S 5/10* (2013.01);
(Continued)

(58) Field of Classification Search
CPC ........ G01S 19/421; G01S 19/04; G01S 19/07; G01S 19/54; G01S 19/55
See application file for complete search history.

(56) References Cited

U.S. PATENT DOCUMENTS

| | | | | | |
|---|---|---|---|---|---|
| 4,812,991 A | * | 3/1989 | Hatch | ...................... | G01S 19/44 701/470 |
| 4,963,889 A | * | 10/1990 | Hatch | ...................... | G01S 19/44 342/357.27 |

(Continued)

FOREIGN PATENT DOCUMENTS

WO       2017051384 A1    3/2017

OTHER PUBLICATIONS

P. Misra et al, "Global Positioning System: Signals, Measurements, and Performance"; revised second edition; section 7.4.1 on pp. 251-253; Ganga-Jamuna Press, Lincoln, MA, USA; copyright in the year 2012. ISBN 978-0-97095442-8. (Year: 2012).*

(Continued)

*Primary Examiner* — Bernarr E Gregory
(74) *Attorney, Agent, or Firm* — Murphy, Bilak & Homiller, PLLC

(57) ABSTRACT

Embodiments relate to a location server, a wireless device and methods performed therein for positioning the wireless device. The wireless device (120) is arranged to perform measurements associated to estimating the position of the wireless device (120), wherein the wireless device (120) is configured to: perform a code phase measurement on a satellite signal between a satellite and the wireless device
(Continued)

(120), wherein the code phase measurement indicates a number of cycles of a code phase of the satellite signal, the number comprising a first integer part and a first fractional part; perform a carrier phase measurement on the first fractional part; and send to a location server (130) a report of the code phase measurement and the carrier phase measurement, for estimating the position of the wireless device (120).

24 Claims, 12 Drawing Sheets

(51) Int. Cl.
G01S 5/00 (2006.01)
G01S 5/10 (2006.01)
G01S 19/09 (2010.01)
G01S 19/44 (2010.01)
H04W 64/00 (2009.01)
G01S 19/43 (2010.01)
G01S 19/00 (2010.01)

(52) U.S. Cl.
CPC .............. *G01S 19/09* (2013.01); *G01S 19/44* (2013.01); *H04W 64/003* (2013.01)

(56) References Cited

U.S. PATENT DOCUMENTS

| | | | | |
|---|---|---|---|---|
| 5,072,227 A * | 12/1991 | Hatch | ............... | G01S 19/55 342/357.38 |
| 5,148,179 A * | 9/1992 | Allison | ............... | G01S 19/44 342/357.31 |
| 5,177,489 A * | 1/1993 | Hatch | ............... | G01S 19/44 342/357.27 |
| 5,471,217 A * | 11/1995 | Hatch | ............... | G01S 19/43 342/357.27 |
| 5,583,513 A * | 12/1996 | Cohen | ............... | G01S 19/04 342/353 |
| 5,899,957 A * | 5/1999 | Loomis | ............... | G01S 19/04 340/988 |
| 5,917,445 A * | 6/1999 | Schipper | ............... | G01S 19/54 342/357.61 |
| 6,198,430 B1 * | 3/2001 | Hwang | ............... | G01S 19/43 342/357.27 |
| 6,266,009 B1 * | 7/2001 | Hwang | ............... | G01S 19/43 342/357.27 |
| 6,281,841 B1 * | 8/2001 | Nevill | ............... | G01S 19/55 342/424 |
| 6,584,404 B1 | 6/2003 | McBurney et al. | | |
| 7,117,417 B2 * | 10/2006 | Sharpe | ............... | G01S 19/07 714/746 |
| 7,570,204 B1 * | 8/2009 | McGraw | ............... | G01S 19/44 342/357.27 |
| 2007/0052583 A1 * | 3/2007 | Zhodzishsky | ............... | G01S 19/43 342/357.24 |
| 2013/0324154 A1 | 12/2013 | Raghupathy et al. | | |

OTHER PUBLICATIONS

Written Opinion of the International Preliminary Examining Authority for PCT/SE2018/050695, separate sheet section only; dated Jul. 18, 2019. (Year: 2019).*
"3GPP TS 36.214 V14.2.0", 3rd Generation Partnership Project; Technical Specification Group Radio Access Network; Evolved Universal Terrestrial Radio Access (E-UTRA); Physical layer; Measurements (Release 14), Mar. 2017, p. 1-22.
"3GPP TS 36.305 V14.2.0", 3rd Generation Partnership Project; Technical Specification Group Radio Access Network; Evolved Universal Terrestrial Radio Access Network (E-UTRAN); Stage 2 functional specification of User Equipment (UE) positioning in E-UTRAN (Release 14), Jun. 2017, pp. 1-78.
"3GPP TS 36.355 V14.2.0", 3rd Generation Partnership Project; Technical Specification Group Radio Access Network; Evolved Universal Terrestrial Radio Access (E-UTRA); LTE Positioning Protocol (LPP) (Release 14), Jun. 2017, pp. 1-167.
"On Remaining Issues of GNSS RTK Information via LPP", 3GPP TSG-RAN WG2#101bis; R2-1805259; Sanya, China, Apr. 16-20, 2018, pp. 1-10.
"RINEX the Receiver Inependent Exchange Format", International GNSS Service (IGS), RINEX Working Group and Radio Technical Commission for Maritime Services Special Committee 104 (RTCM-SC104), Version 3.03, Jul. 14, 2015, pp. 1-95.
Petrovello, et al., "GNSS Solutions: Carrier phase and its measurement for GNSS", Inside GNSS, www.insidegnss.com; Jul. 2010, pp. 18-22.
"On measurements for UE-assisted GNSS RTK positioning", 3GPP TSG RAN1 Meeting #90; R1-1713314; Prague, Czech Republic, Aug. 21-25, 2017, pp. 1-4.
Montenbruck, Oliver , "Annex A: Data Formats", XP-002786423, 2017, pp. 1-28.
"3GPP TS 36.305 V14.1.0"; 3rd Generation Partnership Project; Technical Specification Group Radio Access Network; Evolved Universal Terrestrial Radio Access Network (E-UTRAN); Stage 2 functional specification of User Equipment (UE) positioning in E-UTRAN (Release 14), Mar. 2017, pp. 1-78.
"Differential GNSS (Global Navigation Satellite Systems) Services—Version 3", RTCM Standard 10403.3, Oct. 7, 2016, pp. 1-285.

* cited by examiner

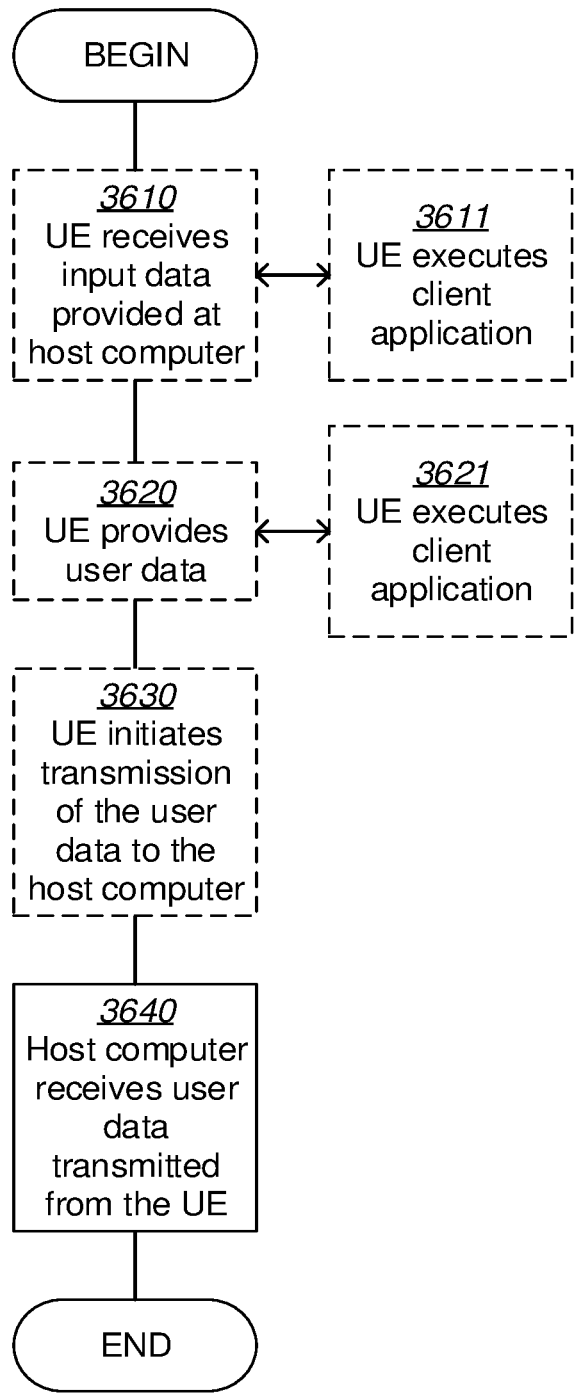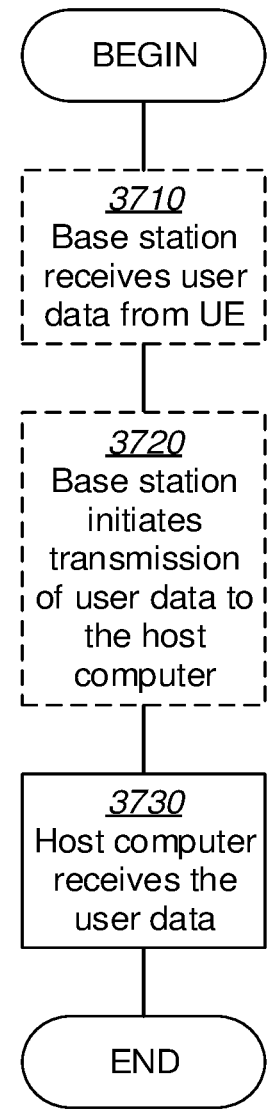
Fig. 14
Fig. 15

METHOD AND APPARATUS IN A GLOBAL NAVIGATION SYSTEM

TECHNICAL FIELD

Embodiments herein relate to a location server, a wireless device and methods performed therein. Furthermore, a computer program product and a computer readable storage medium are also provided herein. In particular, embodiments herein relate to estimating a position of the wireless device.

BACKGROUND

Positioning in Long Term Evolution (LTE) can be performed using the architecture in FIG. 1, with direct interactions between a UE 120 and a location server (e.g., an Evolved-Serving Mobile Location Centre (E-SMLC)) 130 via the LTE Positioning Protocol (LPP). Moreover, there are also interactions between the location server 130 and an eNodeB 110 via the LTE Positioning Protocol A (LPPa) protocol. To some extent the positioning in LTE involves interactions between the eNodeB 110 and the UE 120 via the Radio Resource Control (RRC) protocol.

The following positioning techniques are considered in LTE (e.g., $3^{rd}$ Generation Partnership Project Technical Specification, 3GPP TS, 36.305):

Enhanced Cell ID. Essentially cell ID information to associate the UE to the serving area of a serving cell, and then additional information to determine a finer granularity position.

Assisted Global Navigation System (GNSS). GNSS information retrieved by the UE, supported by assistance information provided to the UE from the E-SMLC.

Observed Time Difference of Arrival (OTDOA). The UE estimates the time difference of reference signals received from different base stations and sends to the E-SMLC for multilateration.

Uplink Time Difference of Arrival (Uplink TDOA, UTDOA). The UE is requested to transmit a specific waveform that is detected by multiple location measurement units (e.g. an eNB) at known positions. These measurements are forwarded to E-SMLC for multilateration.

In LTE, $3^{rd}$ Generation Partnership Project, 3GPP, Rel. 15 positioning work item (WI), one main objective is to provide support for Real Time Kinematics (RTK) GNSS positioning. It has been also agreed that both UE-based and UE-assisted RTK GNSS positioning would be supported. In case of UE-assisted RTK GNSS, the UE is required to send appropriate satellite signalling measurements to the location server in order to allow the network to provide high accuracy positioning estimations. The GPS satellites may transmit signals on two carrier frequencies. One of the carriers may be an L1 carrier which is 1575.42 MHz and carry both a status message and a pseudo random code for timing. The other carrier may be an L2 carrier, which is 1227.60 MHz and is used for the more precise military pseudo-random code.

The pseudo random code is a complicated digital code, or in other words, a complicated sequence of "on" and "off" pulses which resembles random electrical noise. Hence the code is named "Pseudo Random", or "Pseudo Random noise".

In a code phase measurement, a GNSS receiver, e.g. UE, determines the travel time of a signal from a satellite by comparing the "pseudo random code" generated by the GNSS receiver, with an identical code in the signal from the satellite. The receiver "slides" its code later and later in time until it syncs up with the satellite's code. The amount it must slide the code is equal to the signal's travel time. However, it is a problem that the bits (or cycles) of the pseudo random code are so wide that they cannot be perfectly synced. As a result, code measurements are only precise to the meter level.

The carrier phase measurement is a measure of the range between a satellite and receiver expressed in units of cycles of the carrier frequency. This measurement can be made with very high precision (of the order of millimeters), but the whole number of cycles between satellite and receiver is not measurable.

The pseudo random code may have a bit rate of about 1 MHz, and the carrier frequency may have a cycle rate of over 1 GHz, which is 1000 times faster.

FIG. 2 compares the carrier phase and code phase measurements. As can be seen in the FIG. 2, the carrier frequency is hard to count because of its uniform behaviour. Every cycle looks the same. The pseudo random code on the other hand is intentionally complex to make it easier to become distinguishable. Therefore, to efficiently exploit the carrier phase measurement, it is most helpful to use the code phase measurement to get sufficient accuracy and have only few wavelengths of carrier to determine which cycle really marks the exact timing pulse. However, this timing estimation is still in order of few meters, while a cellular UE in the RTK GNSS system is supposed to be in order of centimetre/decimetre level accuracy and hence it is not sufficient.

SUMMARY

An object herein is to provide a mechanism for improving at least one measurement for facilitating a position estimation of the wireless device. Thereby performance of estimating a position of the wireless device can be improved in an efficient manner.

According to one aspect the object can be achieved by a method performed by a wireless device for performing measurements associated to estimating a position of the wireless device, the method comprises performing a code phase measurement on a satellite signal between a satellite and the wireless device. The code phase measurement indicates a number of cycles of a code phase of the satellite signal. The number comprises a first integer part and a first fractional part. The method also comprises performing a carrier phase measurement on the first fractional part. The method also comprises sending to a location server a report of the code phase measurement and the carrier phase measurement, for estimating the position of the wireless device.

According to another aspect the object can be achieved by a method performed by a location server for estimating a position of a wireless device. The method comprises receiving from the wireless device a report of a code phase measurement and a carrier phase measurement. The code phase measurement is associated to a satellite signal between a satellite and the wireless device. The code phase measurement indicates a number of cycles of a code phase of the satellite signal. The number comprises a first integer part and a first fractional part. The carrier phase measurement is associated to the first fractional part. The method also comprises estimating the position of the wireless device based on the report.

According to another aspect the object can be achieved by a wireless device arranged for performing measurements associated to estimating a position of the wireless device.

The wireless device is configured to perform a code phase measurement on a satellite signal between a satellite and the wireless device, wherein the code phase measurement indicates a number of cycles of a code phase of the satellite signal, the number comprising a first integer part and a first fractional part. The wireless device is also configured to perform a carrier phase measurement on the first fractional part. The wireless device is also configured to send to a location server a report of the code phase measurement and the carrier phase measurement, for estimating the position of the wireless device.

According to another aspect the object can be achieved by a location server arranged for estimating a position of a wireless device. The location server is configured to receive from the wireless device a report of a code phase measurement and a carrier phase measurement. The code phase measurement is associated to a satellite signal between a satellite and the wireless device. The code phase measurement indicates a number of cycles of a code phase of the satellite signal. The number comprises a first integer part and a first fractional part. The carrier phase measurement is associated to the first fractional part. The location server is also configured to estimate the position of the wireless device based on the report.

According to another aspect the object can be achieved by a wireless device comprising a processing circuitry configured to perform a code phase measurement on a satellite signal between a satellite and the wireless device, wherein the code phase measurement indicates a number of cycles of a code phase of the satellite signal, the number comprising a first integer part and a first fractional part. The processing circuitry is also configured to perform a carrier phase measurement on the first fractional part. The processing circuitry is also configured to send to a location server a report of the code phase measurement and the carrier phase measurement, for estimating the position of the wireless device.

According to another aspect the object is achieved by providing a location server comprising processing circuitry configured to receive from the wireless device a report of a code phase measurement and a carrier phase measurement. The code phase measurement is associated to a satellite signal between a satellite and the wireless device. The code phase measurement indicates a number of cycles of a code phase of the satellite signal. The number comprises a first integer part and a first fractional part. The carrier phase measurement is associated to the first fractional part. The processing circuitry is also configured to estimate the position of the wireless device based on the report.

It is furthermore provided herein a radio communication network, comprising the wireless device and the location server as above.

It is furthermore provided herein a computer program product comprising instructions, which when executed by the wireless device or the location server, cause the by the wireless device or the location server to carry out any of the methods above. It is additionally provided herein a computer-readable storage medium, having stored thereon the above computer program product.

The carrier phase measurement in the physical layer is thus only performed on the part corresponding to the fractional part of, instead of all, cycles of the code phase measurement in the physical layer. The carrier phase measurement in the physical layer is therefore enabled, since it will contain fewer number of carrier phase cycles. Embodiments herein enable higher positioning precision by combining the carrier phase measurement with the code phase measurement in the physical layer.

BRIEF DESCRIPTION OF THE DRAWINGS

Embodiments will now be described in more detail in relation to the enclosed drawings, in which:

FIGS. 10-15 are flowcharts illustrating methods implemented in a communication system including a host computer, a base station and a user equipment.

DETAILED DESCRIPTION

Figure 1:
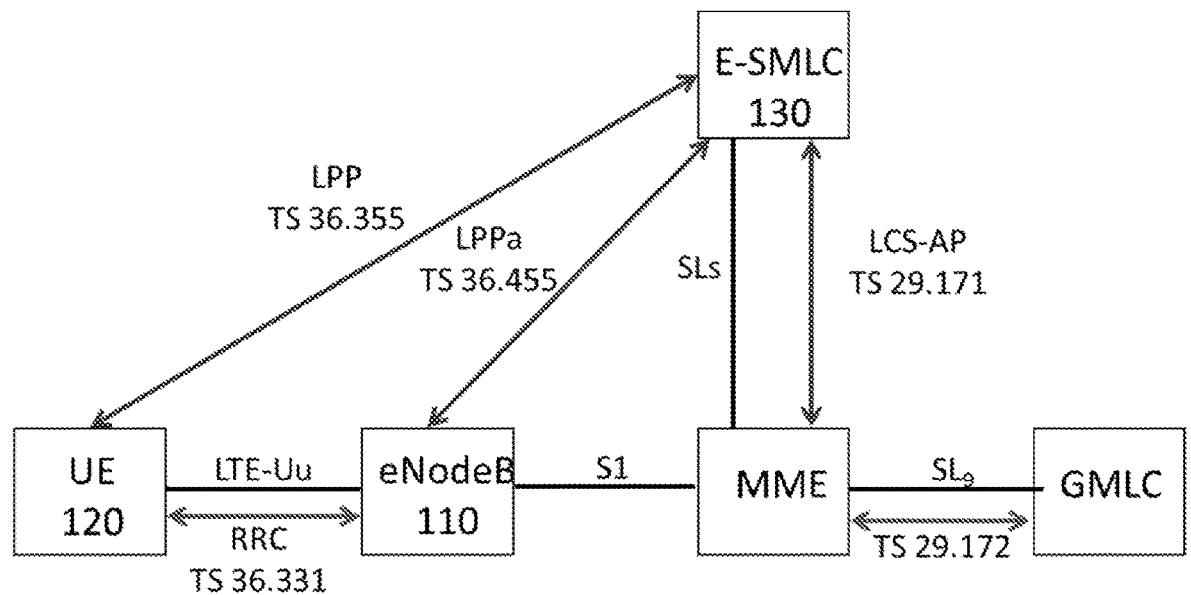
FIG. 1 is a schematic diagram depicting an architecture supporting positioning in LTE.
Figure 2:
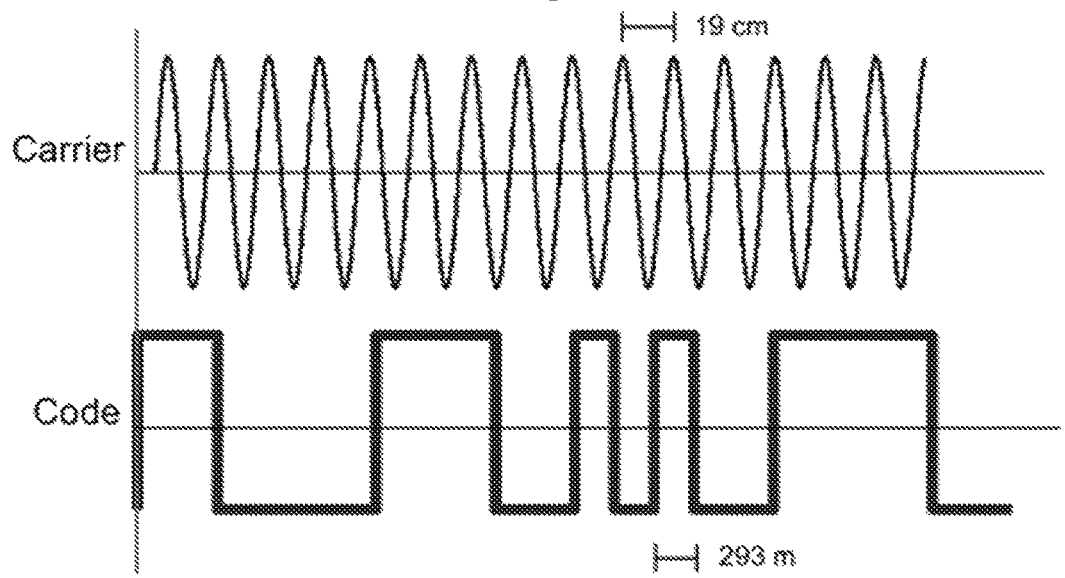
FIG. 2 is a schematic diagram illustrating a carrier phase and code phase measurements.

As a part of explaining embodiments herein, a problem of the so-called solution will first be identified and discussed.

An object of embodiments herein is to improve the performance of a wireless communications network.

The code phase measurement measures a travel time of a satellite signal from a satellite to a receiver by considering the pseudo random code carried in the satellite signal.

The carrier phase measurement measures a travel time of a satellite signal between a satellite and receiver expressed in units of cycles of the carrier frequency, over which the satellite signal is transmitted.

The code phase measurement is already defined in 3GPP TS 36.214, "Evolved Universal Terrestrial Radio Access (E-UTRA); Physical layer—Measurements", however the carrier phase measurement in physical layer is not supported by 3GPP TS 36.214. The report according to 3GPP TS 36.214 therefore only contains the code phase measurement, which can be only precise to the meter level.

The present disclosure could be useful for improving the 3GPP TS 36.214 by enabling the carrier phase measurement in physical layer. Therefore the carrier phase measurement in combination with the code phase measurement in the physical layer will improve the positioning precision.

According to embodiments herein, the code phase measurement in the physical layer is performed on the satellite signal. The code phase measurement may indicate that from a satellite to a receiver there are, e.g., 20.3 cycles of the pseudo random code, wherein 20 is an integer part of the cycles, and 0.3 is a fractional part of the cycles. Then the carrier phase measurement is performed on the fractional part 0.3 of the cycles. Similar to the code phase measurement, the carrier phase measurement may also comprise both an integer part and a fractional part, e.g., 5.7 cycles of the carrier frequency, where 5 is the integer part and 0.7 is the fractional part. As can be seen the carrier phase measurement according to the embodiments herein does not include all the cycles of the carrier phase from the satellite to the device, only the part corresponding to the fractional part of the code phase cycles. The carrier phase measurement therefore is enabled herein due to it will contain fewer number of cycles, i.e., fewer integer and fractional parts. Accordingly the positioning precision is improved by the carrier phase measurement in combination with the code phase measurement in the physical layer.

With respect to the carrier phase measurement, embodiments herein may introduce a Root Mean Square (RMS) error to indicate uncertainty of the carrier phase measurement. Additionally or alternatively, embodiments herein may introduce a carrier phase sign indicator indicating a direction from a previous carrier phase measurement. The carrier phase sign indicator may have both positive and negative values. Since the carrier phase sign indicator has both positive and negative values, it will be indicated that the device, e.g., the wireless device 120, is moving further away from or approaching the satellite. Therefore a direction of carrier phase measurement change is enabled.

With respect to the code phase measurement, embodiments herein may provide solutions giving network assistance to a UE in properly selecting a measurement reporting resolution. The network assistance, also referred to as measurement reporting resolution assistance, can be initiated either by a request from the UE or by the network itself. The UE may also reveal the resolution selection employed for measurement reporting to the network, e.g., with the hope of validating its current choice and gaining support for further improvements in a parameter selection, e.g., resolution selection.

The embodiments herein may apply to both UE-based and UE-assisted RTK GNSS.

Advantages with embodiments herein may include curing any one of the following deficiencies in the conventional solutions:
- By having proper measurement reporting from the UE, it is possible to support UE-assisted RTK GNSS positioning method, which can be potentially more accurate and efficient compared to the UE-based method.
- The current code phase measurement does not include high resolution which can be retrieved from RTK observation data.
- In order to track users, it would be also necessary to have a sign identification of the carrier phase measurement, as it is not currently possible to understand the direction of carrier phase measurement change.

Figure 6:
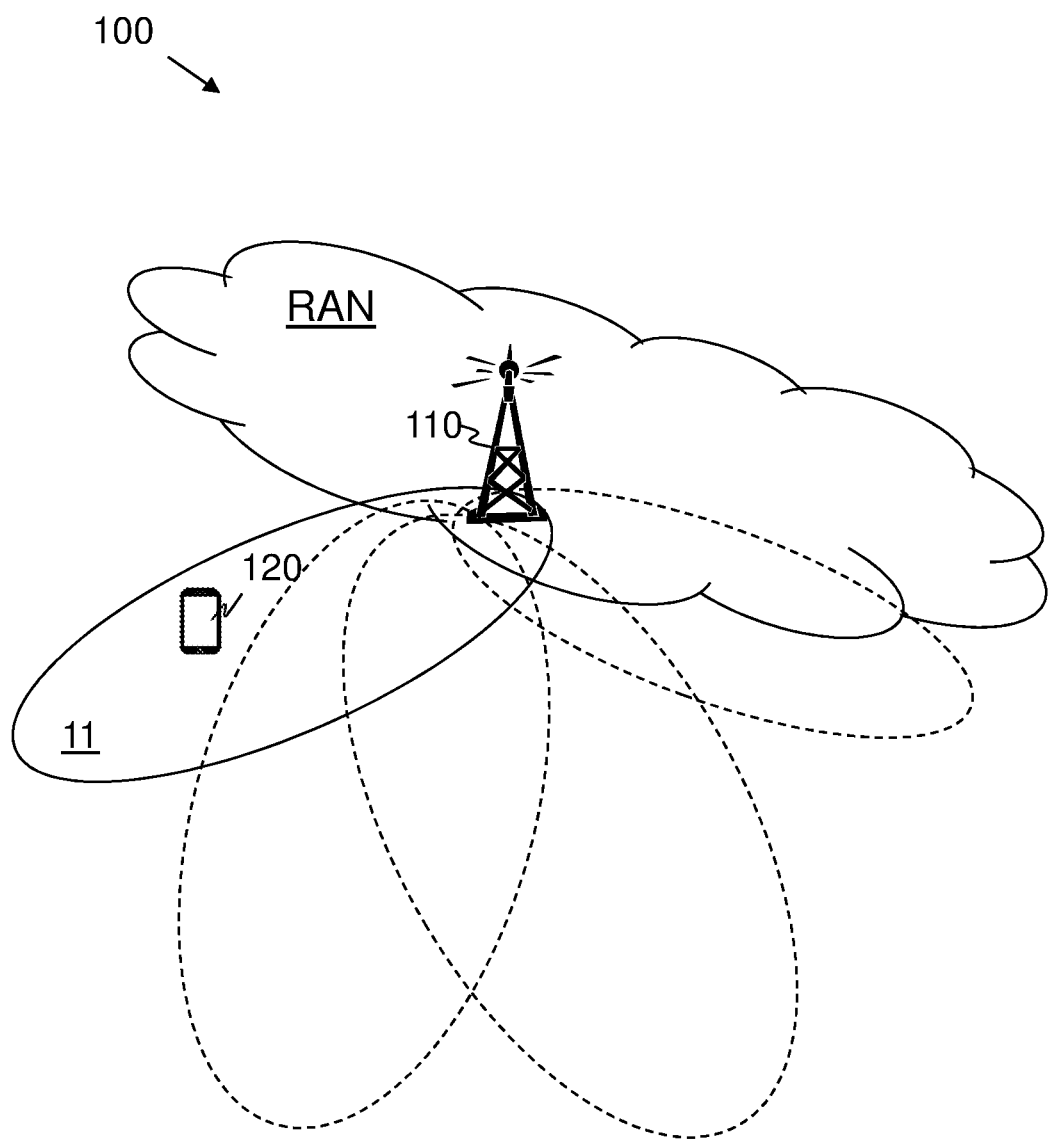
FIG. 6 is a schematic overview depicting a wireless communications network.

Embodiments herein relate to wireless communication networks in general. FIG. 6 is a schematic overview depicting a wireless communications network 100. The wireless communications network 100 comprises one or more RANs and one or more core networks (CNs). The radio communications network 100 may use a number of different technologies, such as NB-IoT, CAT-M, Wi-Fi, eMTC, Long Term Evolution (LTE), LTE-Advanced, 5G, New Radio (NR), Wideband Code Division Multiple Access (WCDMA), Global System for Mobile communications/enhanced Data rate for GSM Evolution (GSM/EDGE), Worldwide Interoperability for Microwave Access (WiMax), or Ultra Mobile Broadband (UMB), just to mention a few possible implementations.

Network nodes operate in the radio communications network 100, such as a network node 110, providing radio coverage over a geographical area, a service area 11, which radio coverage may also be referred to as a beam or a beam group of a first radio access technology (RAT), such as 5G, LTE, Wi-Fi, NB-IoT, CAT-M, Wi-Fi, eMTC or similar. The network node 110 may be a transmission and reception point e.g. a radio access network node such as a Wireless Local Area Network (WLAN) access point or an Access Point Station (AP STA), an access controller, a base station, e.g. a radio base station such as a NodeB, an evolved Node B (eNB, eNode B), an NR Node B (gNB), a base transceiver station, a radio remote unit, an Access Point Base Station, a base station router, a transmission arrangement of a radio base station, a stand-alone access point or any other network unit capable of communicating with a wireless device within the service area served by the network node 110 depending e.g. on the radio access technology and terminology used. The network node 110 may be referred to as a serving radio network node and communicates with a wireless device 120 with Downlink (DL) transmissions to the wireless device 120 and Uplink (UL) transmissions from the wireless device 120.

The wireless communication network 100 may comprise wireless devices such as e.g. a wireless device 120. The wireless device 120 may e.g. be a UE, a mobile station, a non-access point (non-AP) STA, a STA, a user equipment and/or a wireless terminal, an NB-IoT (Internet of Things) device, an eMTC device and a CAT-M device, a WiFi device, an LTE device or an NR device communicating via one or more Access Networks (AN), e.g. RAN, to one or more core networks (CN). It should be understood by the skilled in the art that "wireless device" is a non-limiting term which means any terminal, wireless communication terminal, user equipment, Device to Device (D2D) terminal, or node e.g. smart phone, laptop, mobile phone, sensor, relay, mobile tablets or even a small base station communicating within a cell.

The location server 130 (not shown) is operable in the RTK GNSS for estimating a position of the wireless device 120. An example of the location server 130 may be an E-SMLC. Due to the location server 130 is also a kind of a network node, it may also be called a network node hereinafter.

Figure 7:
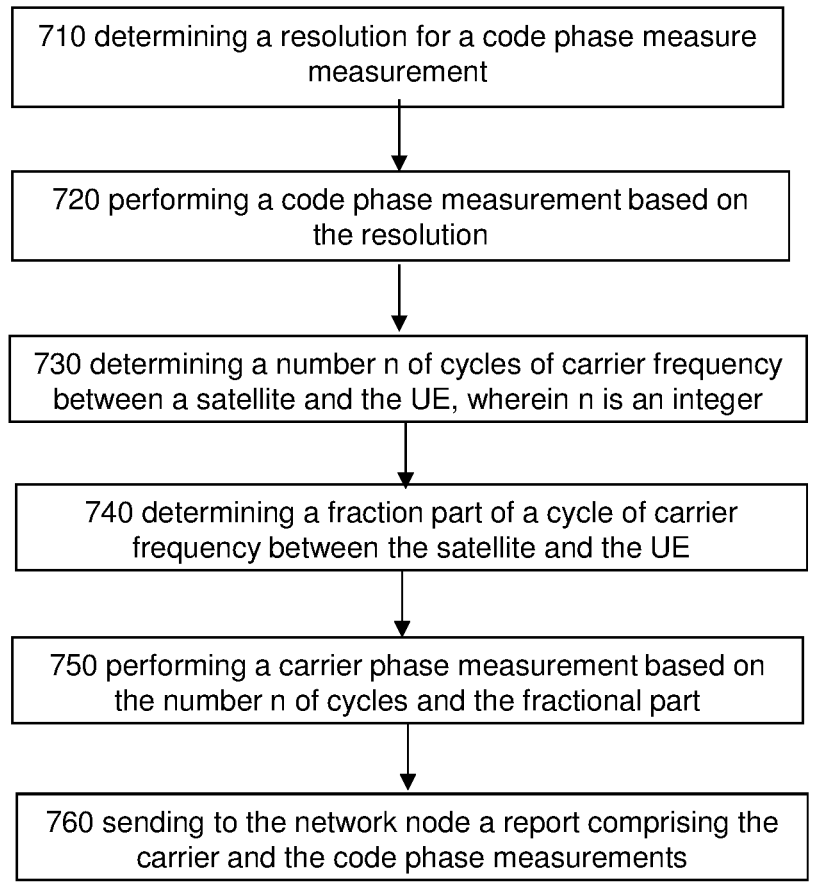
FIG. 7 is another flowchart depicting a method performed by a wireless device according to embodiments herein.

Example embodiments of a method performed by the wireless device 120, e.g., the mobile station, or the user equipment (UE), for reporting at least one measurement to a network node, such as a location server are depicted in FIG. 7 and will be described more in detail in the following. The at least one measurement may comprise the code phase measurement and the carrier phase measurement. The method may comprise one or more of the following actions which actions may be taken in any suitable order.

Before performing the at least one measurement, the wireless device 120 may start with providing (see step 220 of FIG. 3) to the location server 130 a code phase measurement capability of the wireless device 120; and/or a carrier phase measurement capability of the wireless device 120. The wireless device 120 may also provide other parameters for code phase measurements and carrier phase measurement to the location server 130. The wireless device 120 may optionally receive (see step 210 of FIG. 3) from the location server 130 an indication about a desired resolution for a code phase measurement and an estimation of the integer part of the carrier phase measurement.

In action 710 the wireless device 120 may determine a resolution for a code phase measurement.

As discussed above, the code and carrier phase measurements are associated to a code phase and carrier phase of the satellite signal, respectively.

The resolution for a code phase measurement indicates a time duration of one cycle of the code phase. I.e., a time duration of one pseudo random code cycle. For instance, the code phase measurement may have a resolution of ms, which is in scale of decimeter accuracy.

The term resolution for a code phase measurement may also be referred to as a measurement reporting resolution, a report resolution or a resolution in this disclosure.

The wireless device 120 may determine the resolution by using the indicated desired report resolution by the location server 130, or by selecting a different report resolution, which will be discussed in more details in step 220 of FIG. 3.

In action 720 the wireless device 120 may further perform the code phase measurement, e.g., based on the determined resolution.

The wireless device 120 may use the determined resolution to perform the code phase measurement on the pseudo random code which is carried by a satellite signal between a satellite and the wireless device 120.

The wireless device 120 may perform the code phase measurement on the satellite signal between a satellite and the wireless device 120. The code phase measurement indicates how many cycles of the satellite signal's code phase between the satellite and the wireless device 120. In other words, the code phase measurement indicates a number of cycles of the code phase of the satellite signal, i.e., a number of cycles of the satellite signal's code phase. The number normally comprises an integer part and a fractional part, we will call it a first integer part and a first fractional part hereinafter.

Now the carrier phase measurement will be performed on the first fractional part, instead of all the cycles of the code phase, as explained in the following actions 730-750. The carrier phase measurement may also comprise both an integer part and a fractional part of cycles of the carrier phase, which may be referred to as a second integer part and a second fractional part, respectively. Thus the wireless device 120 will determine the second integer part and the second fractional part in actions 730-740 below, respectively.

In action 730 the wireless device 120 may further determine an integer part n of cycles of the carrier frequency, i.e., the second integer part.

The wireless device 120 may determine the second integer part based on a desired integer received from the location server 130.

In action 740 the wireless device 120 may further determine a fractional part of cycle of the carrier frequency, i.e., the second fractional part.

As mentioned above, the determination is made on the first fractional part the code phase, instead of all cycles of the code phase.

In action 750 the wireless device 120 may further perform, on the first fractional part, the carrier phase measurement based on the second integer part n of cycles and the second fractional part, e.g., aggregation of the (second integer part n of cycles+the 10 second fractional part).

In action 760, after having performed both the code and carrier phase measurements as above, the wireless device 120 may further send to the network node a report comprising the carrier and the code phase measurements, e.g., to facilitate the location server 130 in, e.g., a Real Time Kinematic (RTK) Global Navigation System, (GNSS) estimating the position of the wireless device 120.

According to embodiments herein, the report may comprise at least one of:
the carrier phase measurement on the first fractional part, for instance, a number of cycles of a carrier phase of the satellite signal, the number comprising a second integer part and a second fractional part;
a RMS error to indicate uncertainty of the carrier phase measurement, the uncertainty may be an estimate of how far an measurement might be from the corresponding "true value";
a Doppler measurement, which may be used to compute a velocity and/or acceleration of the wireless device 120; and
a carrier phase sign indicator indicating a direction from a previous carrier phase measurement, i.e., indicating the wireless device 120 is moving further away from or approaching the satellite.

The report may further comprise the determined resolution for the code phase measurement, and other information, which will be explained further in below.

According to some embodiments, the UE 120 may receive a required resolution for a code phase measurement; and may determine the resolution based on the required resolution.

According to some embodiments, the UE 120 may receive the number n of cycles from the location server 130; and the UE 120 may determine the number n of cycles by using it directly.

According to some embodiments, the UE 120 may send a capability reporting of each measurement to the location server 130.

According to some embodiments, the UE 120 may send an uncertainty report of the measurements.

Figure 4:
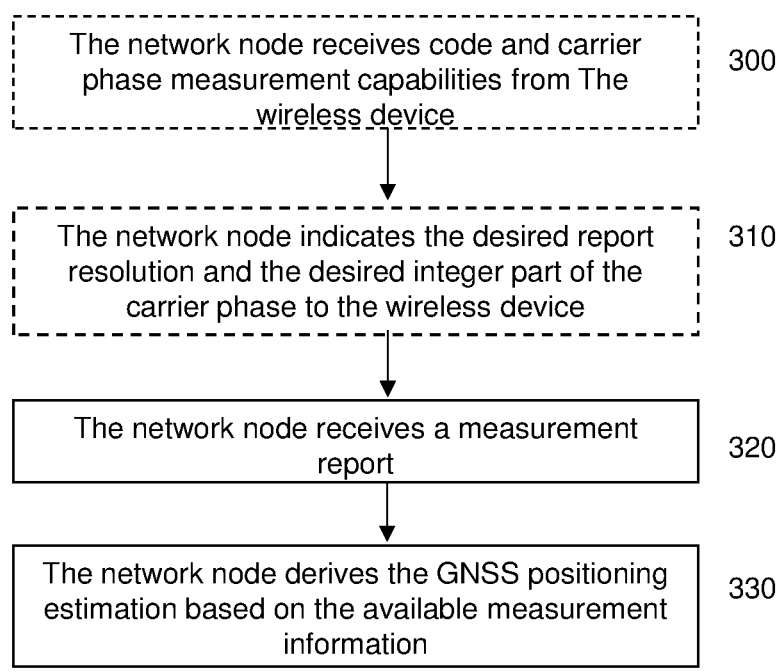
FIG. 4 is a flowchart depicting a method performed by a network node according to embodiments herein.

Example embodiments of a flowchart depicting embodiments of a method performed by a location server 130, in a Real Time Kinematic (RTK) Global Navigation System (GNSS) for estimating a position of the wireless device, i.e., a user equipment (UE), is illustrated in FIG. 4 and will be described more in detail in the following. The location server 130 may also be called a network node, e.g. E-SMLC. The method may comprise one or more of the following actions which actions may be taken in any suitable order.

Actions 300-310 are corresponding to the actions 200-210, respectively.

In action 300, the network node, i.e., the location server 130, may receive the code and/or carrier phase measurement capabilities from the wireless device 120. The location server 130 may also receive other parameters for code phase measurements and carrier phase measurement from the wireless device 120.

In action 310, the network node, i.e., the location server 130, may indicate the desired report resolution and the desired integer part of the carrier phase to the wireless device 120.

In action 320, the location server 130, i.e., the location server 130, may receive the report comprising the carrier and the code phase measurements from the UE 120.

The code phase measurement is on the satellite signal between a satellite and the wireless device, i.e., UE, 120.

The code phase measurement indicates the number of cycles of a code phase of the satellite signal. The number comprises the first integer part and the first fractional part. The carrier phase measurement is on the first fractional part.

As described above the code phase measurement may be based on a resolution determined by the UE, the carrier phase measurement may be performed based on a number n of cycles of carrier frequency between a satellite and the UE, and a fractional part of a cycle of carrier frequency between the satellite and the UE, wherein n is an integer.

In action 330, the location server 130, i.e., the location server 130, may estimate the position of the UE based on the report. For instance, the network node, i.e., the location server 130, may derive the GNSS positioning estimation based on the available measurement information, e.g. the received report.

Figure 8:
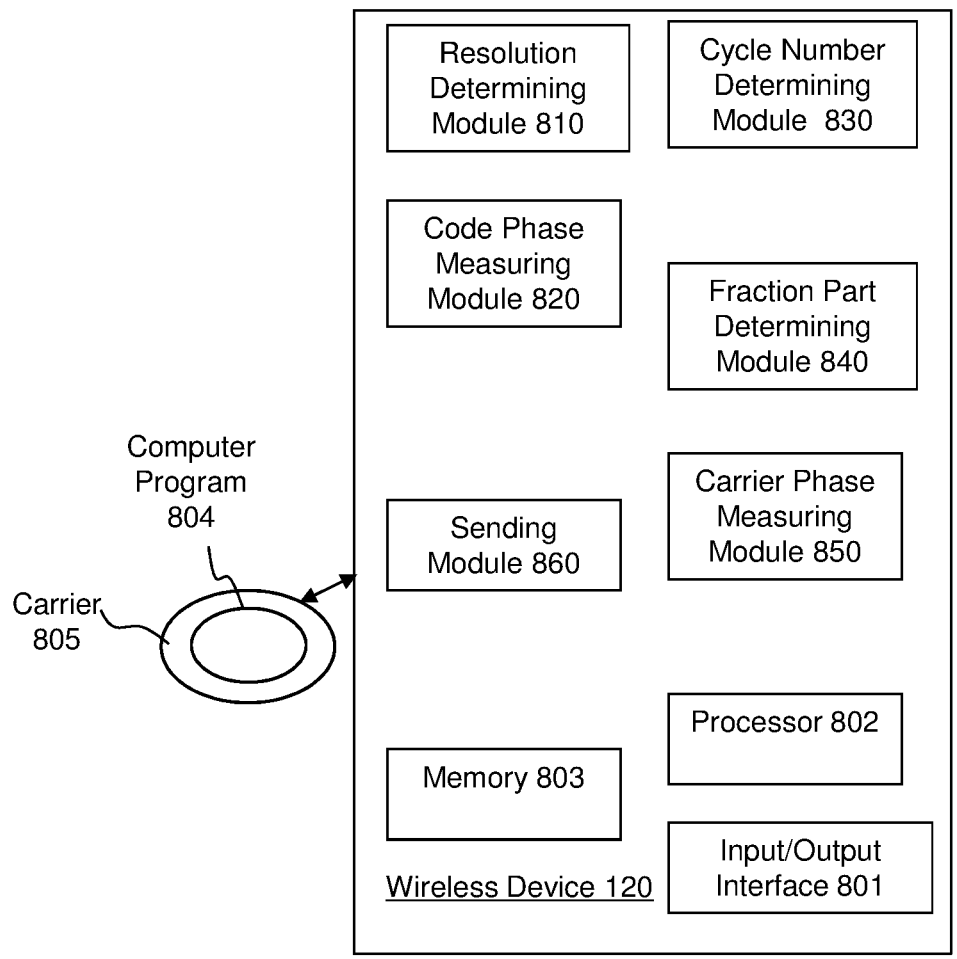
FIG. 8 is a schematic block diagram depicting a wireless device according to embodiments herein.

To perform the method actions e.g. for reporting at least one measurement to the location server 130, the wireless device 120, e.g., the mobile station 120, may comprise the arrangement depicted in FIG. 8. The wireless device 120 may e.g. comprise a resolution determining module 810, a code phase measuring module 820, a cycle number determining module 830, a fractional part determining module 840, a carrier phase measuring module 850 and a sending module 860, which are configured to perform the corresponding actions of the method described in FIG. 7 or FIG. 3.

The wireless device 120 and/or the resolution determining module 810 may be configured to determine the resolution for the code phase measurement based on the desired resolution received from the location server 130, wherein the resolution indicates a time duration of one cycle of the code phase.

The wireless device 120 and/or the code phase measuring module 820 may be configured to perform a code phase measurement on a satellite signal between a satellite and the wireless device 120, wherein the code phase measurement indicates a number of cycles of a code phase of the satellite signal, the number comprising a first integer part and a first fractional part. The wireless device 120 and/or the code phase measuring module 820 may be further configured to perform the code phase measurement based on the determined resolution.

The wireless device 120 and/or the cycle number determining module 830 may be configured to determine an integer part of the cycles of the carrier phase, i.e., the second integer part. The wireless device 120 and/or the cycle number determining module 830 may further be configured to determine the second integer part based on the desired integer received from the location server 130.

The wireless device 120 and/or the fractional part determining module 840 may be configured to determine the fractional part of the cycles of the carrier phase.

The wireless device 120 and/or the carrier phase measuring module 850 may be configured to perform a carrier phase measurement on the first fractional part, i.e., the second fractional part.

The wireless device 120 and/or the sending module 860 may be configured to send to the location server 130 the report of the code phase measurement and the carrier phase measurement, for estimating the position of the wireless device 120. The report comprises at least one of: the number of cycles of the carrier phase, the number comprising the second integer part and the second fractional part; the RMS error to indicate uncertainty of the carrier phase measurement; the Doppler measurement; and the carrier phase sign indicator indicating a direction from a previous carrier phase measurement. The report may further comprise the determined resolution for the code phase measurement.

The wireless device 120 and/or the sending module 860 may further be configured to provide to the location server 130 at least one of: the code phase measurement capability of the wireless device 120; and the carrier phase measurement capability of the wireless device 120.

The wireless device 120 may further be configured to receive from the location server 130 at least one of: the desired resolution for the code phase measurement; and and the desired integer part of cycles of a carrier phase of the satellite signal.

Those skilled in the art will also appreciate that the modules in the wireless device 120 described above may refer to a combination of analog and digital circuits, and/or one or more processors configured with software and/or firmware, e.g. stored in the wireless device 120, that when executed by the respective one or more processors such as the processors described above. One or more of these processors, as well as the other digital hardware, may be included in a single Application-Specific Integrated Circuitry (ASIC), or several processors and various digital hardware may be distributed among several separate components, whether individually packaged or assembled into a system-on-a-chip (SoC).

The wireless device 120 may comprise an input and output interface 801 configured to communicate with the location server 130 and/or the network node 110. The input and output interface may comprise a wireless receiver (not shown) and a wireless transmitter (not shown).

The embodiments herein may be implemented through a respective processor or one or more processors, such as the processor 802 of a processing circuitry in the wireless device 120 depicted in FIG. 8, together with respective computer program code for performing the functions and actions of the embodiments herein. The program code mentioned above may also be provided as a computer program product, for instance in the form of a data carrier carrying computer program code for performing the embodiments herein when being loaded into the wireless device 120. One such carrier may be in the form of a CD ROM disc. It is however feasible with other data carriers such as a memory stick. The computer program code may furthermore be provided as pure program code on a server and downloaded to the wireless device 120.

The wireless device 120 may further comprise a memory 803 comprising one or more memory units. The memory comprises instructions executable by the processor in wireless device 120.

The memory is arranged to be used to store e.g. the determined and/or required resolution, the first and/or second integer parts, the first and/or second fractional parts, the capabilities of the wireless device for performing the at least one measurement, the ADR, the RMS error value, data, configurations, and applications to perform the methods herein when being executed in the wireless device 120.

In some embodiments, a respective computer program 804 comprises instructions, which when executed by the respective at least one processor, cause the at least one processor of the wireless device 120 to perform the actions above.

In some embodiments, a respective carrier 805 comprises the respective computer program, wherein the carrier is one of an electronic signal, an optical signal, an electromagnetic signal, a magnetic signal, an electric signal, a radio signal, a microwave signal, or a computer-readable storage medium.

Figure 9:
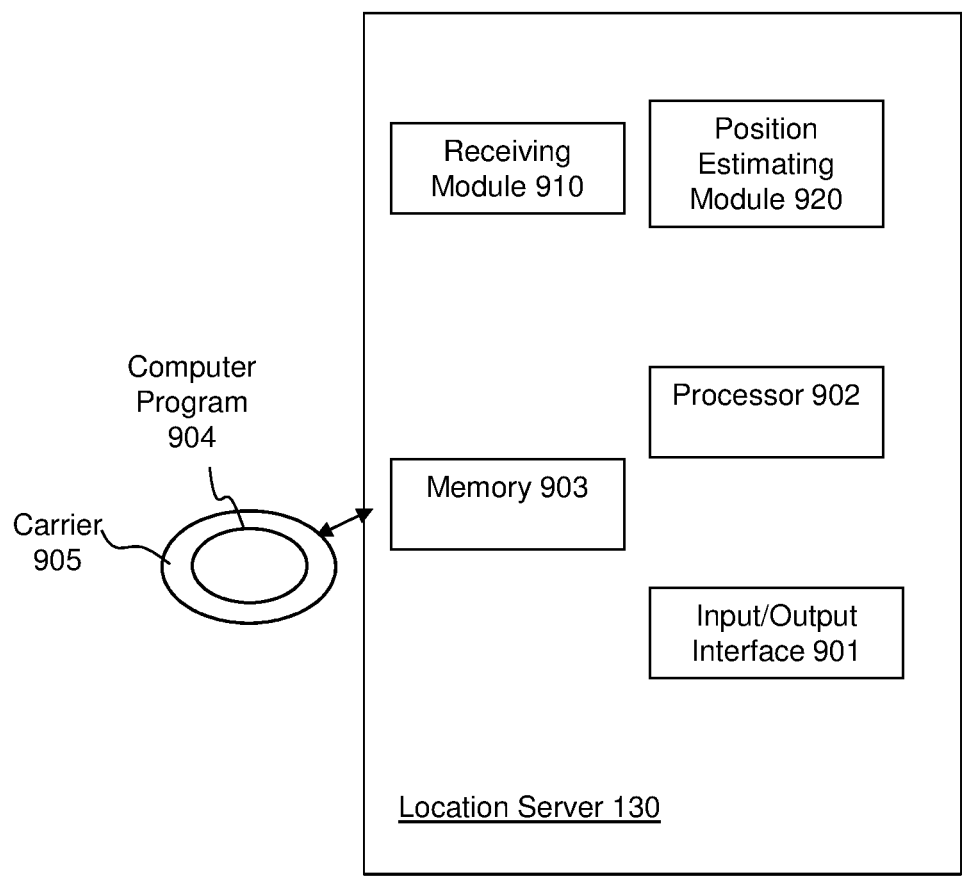
FIG. 9 is a schematic block diagram depicting a location server according to embodiments herein.

To perform the method actions e.g. for estimating a position of a user equipment, the location server 130 may comprise the arrangement depicted in FIG. 9. The location server 130 may e.g. comprise a receiving module 910, and a position estimating module 920, which are configured to perform the corresponding actions in the method described in FIG. 4.

The location server 130 and/or the receiving module 910 may be configured to receive from the wireless device 120 the report of the code phase measurement and the carrier phase measurement. The code phase measurement is associated to the satellite signal between the satellite and the wireless device 120. The code phase measurement indicates the number of cycles of the code phase of the satellite signal. The number comprises the first integer part and the first fractional part. The carrier phase measurement is associated to the first fractional part.

The location server 130 and/or the receiving module 910 may further be configured to receive at least one of: the code phase measurement capability of the wireless device 120; and the carrier phase measurement capability of the wireless device 120.

The location server 130 and/or the position estimating module 920 may be configured to estimate the position of the wireless device 120 based on the report.

The location server 130 may be configured to send to the wireless device at least one of: the desired resolution for the code phase measurement; and the desired integer part of cycles of a carrier phase of the satellite signal.

Those skilled in the art will also appreciate that the modules in the location server 130, described above may refer to a combination of analogy and digital circuits, and/or one or more processors configured with software and/or firmware, e.g. stored in the location server 130, that when executed by the respective one or more processors such as the processors described above. One or more of these processors, as well as the other digital hardware, may be included in a single Application-Specific Integrated Circuitry (ASIC), or several processors and various digital hardware may be distributed among several separate components, whether individually packaged or assembled into a system-on-a-chip (SoC).

The location server 130 may comprise an input and output interface 901 configured to communicate with the network node 110 and/or the wireless device 120. The input and output interface may comprise a wireless receiver (not shown) and a wireless transmitter (not shown).

The embodiments herein may be implemented through a respective processor or one or more processors, such as the processor 902 of a processing circuitry in location server 130 depicted in FIG. 9, together with respective computer program code for performing the functions and actions of the embodiments herein. The program code mentioned above may also be provided as a computer program product, for instance in the form of a data carrier carrying computer program code for performing the embodiments herein when being loaded into the location server 130. One such carrier may be in the form of a CD ROM disc. It is however feasible with other data carriers such as a memory stick. The computer program code may furthermore be provided as pure program code on a server and downloaded to the location server 130.

The location server 130 may further comprise a memory 903 comprising one or more memory units. The memory comprises instructions executable by the processor in location server 130.

The memory is arranged to be used to store e.g. data, configurations, and applications to perform the methods herein when being executed in the location server 130.

In some embodiments, a respective computer program 904 comprises instructions, which when executed by the respective at least one processor, cause the at least one processor of the location server 130 to perform the actions above.

In some embodiments, a respective carrier 905 comprises the respective computer program, wherein the carrier is one of an electronic signal, an optical signal, an electromagnetic signal, a magnetic signal, an electric signal, a radio signal, a microwave signal, or a computer-readable storage medium.

Figure 3:
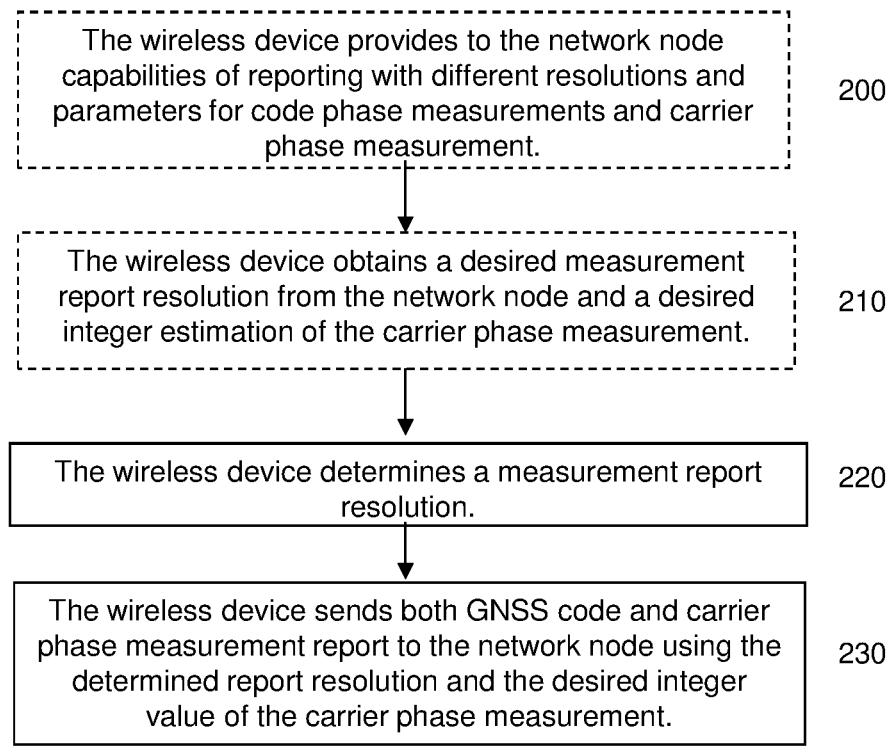
FIG. 3 is a flowchart depicting a method performed by a wireless device according to embodiments herein.

FIG. 3 illustrates a flow chart according to an embodiment from the wireless device 120, e.g., the mobile station, perspective. The wireless device 120 optionally (step 200) provides to the location server 130 its capabilities of code and carrier phase measurements in terms of at least one of the aspects provided in the RTK GNSS measurement report, which will be discussed below. For instance, the wireless device 120 may provide to the location server 130 its capabilities of: e.g., resolution and number of integer cycles, a carrier phase sign indicator considered in the carrier phase measurement. The wireless device 120 may also provide other parameters for code phase measurements and carrier phase measurement.

The wireless device 120 optionally receives from the location server 130 an indication (step 210) in terms of at least one of the aspects provided in the RTK GNSS measurement report, which will be discussed below. For instance, the wireless device 120 optionally receives from the location server 130 an indication (step 210) about the desired report resolution and the desired integer estimation of the carrier phase measurement. The wireless device 120 may agree with the indicated desired report resolution, or select a different report resolution. For example, the wireless device 120 may determine an appropriate report resolution (step 220), e.g., based on estimates accuracy of the measurement. The wireless device 120 sends (step 230) the measurement report and optionally includes information about the selected report resolution. For instance, the wireless device 120 may send a report of both GNSS code and carrier phase measurements to the network node, i.e., location server 130, by using the determined report resolution of the code phase measurement and the desired integer value of the carrier phase measurement.

As discussed above, FIG. 4 illustrates the flow chart of an embodiment from the location server 130 perspective.

Figure 5:
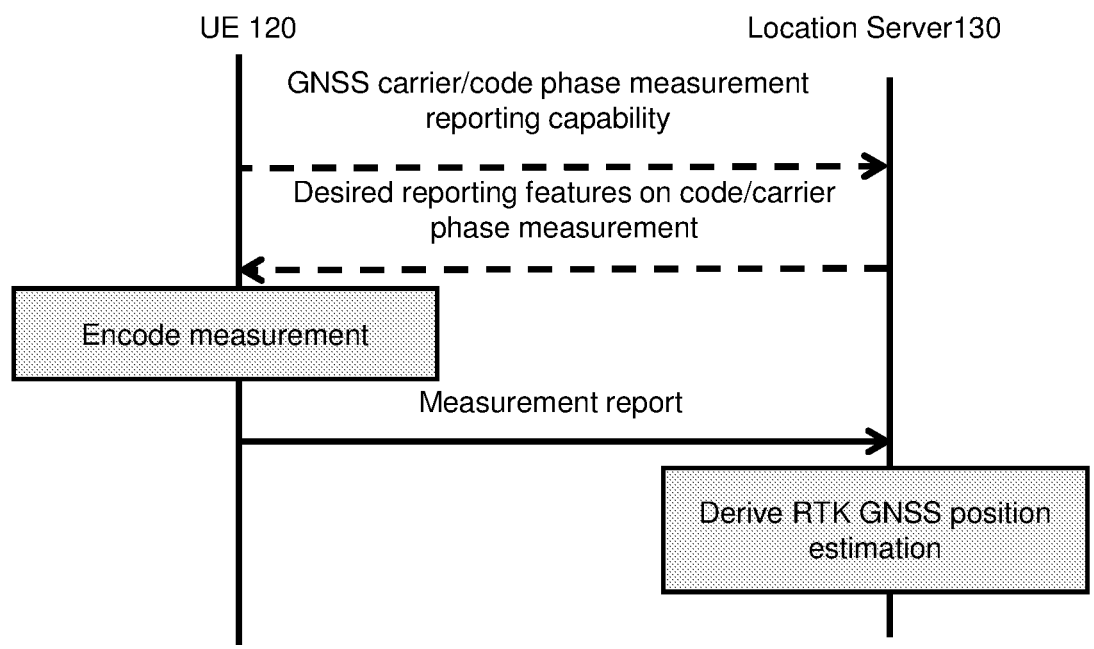
FIG. 5 is a combined flowchart and signalling scheme according to some embodiments herein.

FIG. 5 provides a signaling chart of an embodiment corresponding to FIG. 3-4.

The embodiment enables a systematic approach for the location server to receive proper code and carrier phase measurement for different satellite system. Hence a more accurate positioning estimation obtained at the locations server in which the detailed RTK correction error data is available.

While UE-based RTK GNSS is getting supported by having RTK GNSS network data broadcasted to the UEs, it is also possible to consider that UEs send their code and carrier phase measurements for each satellite to the location server via LPP, and then the location server that already contains the RTK network correction data can provide the more accurate RTK GNSS positioning to the UE.

In UE-assisted RTK GNSS, the UE sends its code and carrier phase measurements for each satellite to the location server (i.e. E-SMLC), and then the location server that already contains the RTK network correction data can provide the more accurate RTK GNSS positioning to the UE. There are already code and carrier phase measurements defined for the UE and reported to the location server. Therefore, UE-assisted RTK GNSS method has already some support in the signalling however due to higher resolution of RTK observation data, the conventional reporting structure is not suitable any longer and needs major modification.

The report sent by the wireless device 120, e.g. mobile station, may also be referred to as a RTK GNSS measurement report or reporting in this disclosure.

RTK GNSS Measurement Reporting

The RTK GNSS measurement report sent by the wireless device 120, e.g. mobile station, can comprise one or a combination of multiple of the following:

GNSS ID and satellite information

Code phase measurement with the potential of different resolution

Code phase measurement Root Mean Square RMS (RMS) error to indicate the measurement uncertainty Carrier frequency of the GNSS signal Carrier phase measurement with few integer cycle and fractional part Carrier phase measurement RMS error to indicate the measurement uncertainty Doppler measurement Carrier phase sign indicator to indicate the direction from the previous measurement Overflow and/or underflow indicator, when the measurement compared to the most recent measurement report has passed the maximum encodable measurement and minimum encodable measurement.

The GNSS ID is to identify a specific GNSS to which the report is associated.

The Doppler measurement may be converted into unit of m/s by multiplying the Doppler measurement in Hz by a nominal wavelength of the measured signal. Doppler Effect (or the Doppler shift) is the change in frequency or wavelength of a wave for an observer who is moving relative to a wave source. Doppler is measured by the wireless device 120 for a particular satellite signal.

While a required higher resolution has been sent by the location server 130 to the UE 120, there can be several different strategies on how to exploit this capability. In one embodiment, the UE 120 may always use the indicated reporting resolution. In another embodiment, the UE 120 may select between several reporting resolution options.

In one embodiment, the selection of measurement reporting resolution is sent to the UE, e.g., the mobile station 120, as an assisted data. The selection mechanisms can be mandatory for the UE 120, or it can be up to the UE 120 to use the indicated resolution or reject it (and choose its own preference). In one embodiment, the UE 120 will indicate its measurement reporting resolution in the feedback to the location server 130. In the case that the location server 130 has sent a suggested measurement reporting resolution, the UE 120 may be required to respond with the adopted resolution.

One of the main use cases in positioning is when a UE 120 is being tracked, in this scenario, to optimize the computation process, the positioning estimation is not done based on each received set of measurements, but when there is some sudden change in the UE measurement. Therefore the carrier phase measurement and Doppler may both have negative values also included to indicate whether the device is getting further away from the satellite or approaching in its direction.

One main consideration is also that as the carrier phase measurement does not include all the cycles from the satellite to the device, all the corresponding carrier phase measurements may be conditionally available together with the code phase measurement.

Signaling Support for Some Embodiment

For code phase measurement, there is already UE measurement defined in 3GPP TS 36.214 as it is indicated below:

UE GNSS Code Measurement is Shown in Table 1:

TABLE 1

| | |
|---|---|
| Definition | The GNSS code phase (integer and fractional parts) of the spreading code of the $i^{th}$ GNSS satellite signal. The reference point for the GNSS code phase shall be the antenna connector of the UE. |
| Applicable for | Void (this measurement is not related to E-UTRAN/UTRAN/GSM signals; its applicability is therefore independent of the UE RRC state) |

GNSS-MeasurementList in LPP (3GPP TS 36.355) is reproduced in Table 2. In the LPP signalling as shown below, there is already support for reporting "adr" which stands for Accumulated Delta Range and is a measurement/estimate of the carrier phase of the GNSS carrier measured by the UE 120. This measurement is not defined in the current version of 36.214. Moreover, there can be more details about the measurement that needs to be reported even in the LPP signalling. Therefore, we propose to have UE GNSS carrier phase measurement defined in 36.214.

GNSS-MeasurementList in LPP Signalling:

TABLE 2

```
-- ASN1START
GNSS-MeasurementList         ::=    SEQUENCE    (SIZE(1..16))    OF    GNSS-
MeasurementForOneGNSS
GNSS-MeasurementForOneGNSS ::= SEQUENCE {
    gnss-ID                                                            GNSS-
ID,
    gnss-SgnMeasList                             GNSS-SgnMeasList,
    ...
}
GNSS-SgnMeasList ::= SEQUENCE (SIZE(1..8)) OF GNSS-SgnMeasElement
GNSS-SgnMeasElement ::= SEQUENCE {
    gnss-SignalID                                GNSS-SignalID,
    gnss-CodePhaseAmbiguity                      INTEGER (0..127)
    OPTIONAL,
    gnss-SatMeasList                             GNSS-SatMeasList,
    ...
}
GNSS-SatMeasList ::= SEQUENCE (SIZE(1..64)) OF GNSS-SatMeasElement
GNSS-SatMeasElement ::= SEQUENCE {
    svID                                         SV-ID,
    cNo                                          INTEGER (0..63),
```

TABLE 2-continued

| | |
|---|---|
| mpathDet | ENUMERATED {notMeasured (0), low(1), medium (2), high (3),...}, |
| carrierQualityInd OPTIONAL, | INTEGER (0..3) |
| codePhase | INTEGER (0..2097151), |
| integerCodePhase OPTIONAL, | INTEGER (0..127) |
| codePhaseRMSError | INTEGER (0..63), |
| doppler OPTIONAL, | INTEGER (−32768..32767) |
| adr (0..33554431) | INTEGER OPTIONAL, |
| ... | |
| } | |
| -- ASN1STOP | |

The carrier phase measurement will contain few integer cycles and the fractional carrier phase measurement, since the integer cycle ambiguity prevents an actual range measurement. The UE-assisted RTK will let the ambiguity resolution take place in the network node which is the location server 130 instead. It is like having a 20 cm school ruler with mm-readings, and the measurement is the mm-reading, but the integer number of school rulers up to the satellite is unknown. The code phase can help telling approximately how many rulers are needed, but we still will have unknown 10-20 rulers.

The LPP specification 3GPP TS 36.355 includes an accumulated delta range measurement, which is an estimate of the carrier phase of a GNSS signal. However, this measurement has not yet been defined in 3GPP TS 36.214. Some embodiments may solve the problem that the already available "adr" signaling does not have any definition in the physical layer specification.

The following addition can be considered in 3GPP TS 36.214 to provide the carrier phase measurement support in physical layer:
UE GNSS Carrier Phase Measurement is Shown in Table 3:

TABLE 3

| | |
|---|---|
| Definition | The GNSS carrier phase (of few integer cycle and fractional parts) of the spreading carrier frequency pulse of the i$^{th}$ GNSS satellite signal. The reference point for the GNSS carrier phase shall be the antenna connector of the UE. |
| Applicable for | Void (this measurement is not related to E-UTRAN/UTRAN/GSM signals; its applicability is therefore independent of the UE RRC state) |

According to some embodiments, the carrier phase measurement is performed only in combination with the UE GNSS code phase measurement.

According to an embodiment, it is proposed to define adrRMSError field to represent the uncertainty of the UE 120 for the carrier phase measurement.

There is a need to also have the uncertainty factor of the carrier phase measurement indicated by the UE 120. Similar to what is already available for the code phase measurement, it is therefore proposed to have an adrRMSError to indicate the Root Mean Square (RMS) error value. The parameter can be specified according to a floating-point representation already defined in 36.355.

In the current definition of "adr" field the range is defined as always a positive value. While the Doppler sign could become helpful to sort out the overflow, especially in a log file with dense samples in time, with much more sparse sampling (i.e. 1-10 s), then the device may be moving by more than one cycle in between samples and therefore neither the "lock indicator" defined in LPPe for the same application and the Doppler would be sufficient to assist in handling the sparse UE measurement. The "adr" field definition in its current format may be inadequate for carrier phase measurement, and we suggest having negative values for the same range for adr. Adding the "adr" sign with negative values allows the full range of carrier phase measurement direction.

Aside from the carrier phase measurements, the code phase measurement already reported by the UE 120 has a resolution of ms, which is in scale of decimeter accuracy, and too coarse while comparing it to the RTK observation data. As it is not possible to change the range of code phase for the legacy UEs, there is a need to define a finer resolution for this measurement with the help of code phase delta table. The code phase delta provides extra bits to be combined with the legacy reported code phase measurement, in order to increase the resolution of this measurement and to have more number of bits to map to higher resolution.

Further Extensions and Variations

Figure 10:
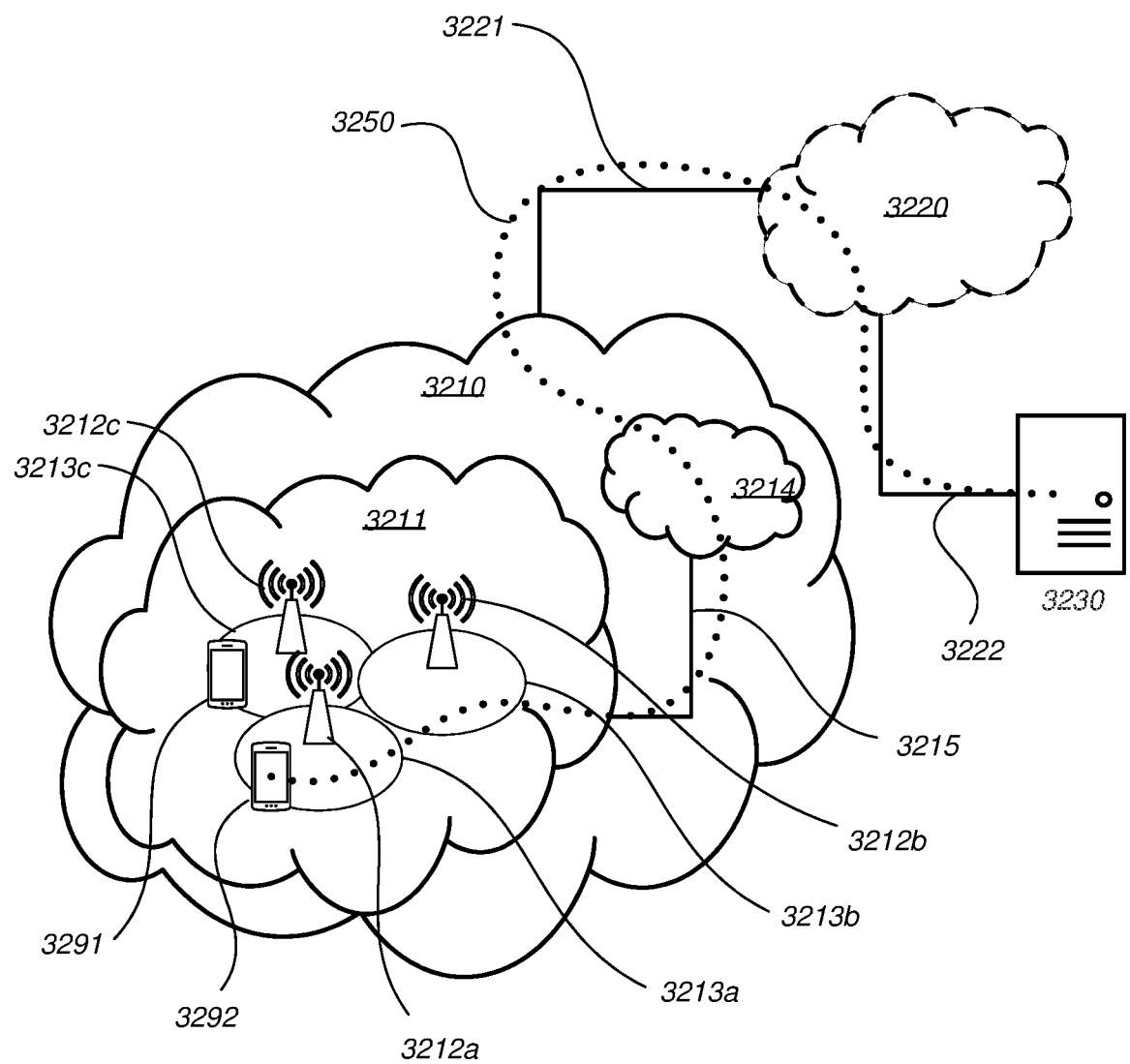

With reference to FIG. 10, in accordance with an embodiment, a communication system includes a telecommunication network 3210 such as the wireless communications network 100, e.g. a WLAN, such as a 3GPP-type cellular network, which comprises an access network 3211, such as a radio access network, and a core network 3214. The access network 3211 comprises a plurality of base stations 3212a, 3212b, 3212c, such as the wireless device 120, access nodes, AP STAs NBs, eNBs, gNBs or other types of wireless access points, each defining a corresponding coverage area 3213a, 3213b, 3213c. Each base station 3212a, 3212b, 3212c is connectable to the core network 3214 over a wired or wireless connection 3215. A first user equipment (UE) e.g. the wireless device 120 such as a Non-AP STA 3291 located in coverage area 3213c is configured to wirelessly connect to, or be paged by, the corresponding base station 3212c. A second UE 3292 e.g. the wireless device 120 such as a Non-AP STA in coverage area 3213a is wirelessly connectable to the corresponding base station 3212a. While a plurality of UEs 3291, 3292 are illustrated in this example, the disclosed embodiments are equally applicable to a situation where a sole UE is in the coverage area or where a sole UE is connecting to the corresponding base station 3212.

The telecommunication network 3210 is itself connected to a host computer 3230, which may be embodied in the hardware and/or software of a standalone server, a cloud-implemented server, a distributed server or as processing resources in a server farm. The host computer 3230 may be under the ownership or control of a service provider, or may be operated by the service provider or on behalf of the service provider. The connections 3221, 3222 between the telecommunication network 3210 and the host computer 3230 may extend directly from the core network 3214 to the host computer 3230 or may go via an optional intermediate network 3220. The intermediate network 3220 may be one of, or a combination of more than one of, a public, private or hosted network; the intermediate network 3220, if any, may be a backbone network or the Internet; in particular, the intermediate network 3220 may comprise two or more sub-networks (not shown).

The communication system of FIG. 10 as a whole enables connectivity between one of the connected UEs 3291, 3292 and the host computer 3230. The connectivity may be described as an over-the-top (OTT) connection 3250. The host computer 3230 and the connected UEs 3291, 3292 are configured to communicate data and/or signaling via the OTT connection 3250, using the access network 3211, the core network 3214, any intermediate network 3220 and possible further infrastructure (not shown) as intermediaries. The OTT connection 3250 may be transparent in the sense that the participating communication devices through which the OTT connection 3250 passes are unaware of routing of uplink and downlink communications. For example, a base station 3212 may not or need not be informed about the past routing of an incoming downlink communication with data originating from a host computer 3230 to be forwarded (e.g., handed over) to a connected UE 3291. Similarly, the base station 3212 need not be aware of the future routing of an outgoing uplink communication originating from the UE 3291 towards the host computer 3230.

Example implementations, in accordance with an embodiment, of the UE, base station and host computer discussed in the preceding paragraphs will now be described with reference to FIG. 11. In a communication system 3300, a host computer 3310 comprises hardware 3315 including a communication interface 3316 configured to set up and maintain a wired or wireless connection with an interface of a different communication device of the communication system 3300. The host computer 3310 further comprises processing circuitry 3318, which may have storage and/or processing capabilities. In particular, the processing circuitry 3318 may comprise one or more programmable processors, application-specific integrated circuits, field programmable gate arrays or combinations of these (not shown) adapted to execute instructions. The host computer 3310 further comprises software 3311, which is stored in or accessible by the host computer 3310 and executable by the processing circuitry 3318. The software 3311 includes a host application 3312. The host application 3312 may be operable to provide a service to a remote user, such as a UE 3330 connecting via an OTT connection 3350 terminating at the UE 3330 and the host computer 3310. In providing the service to the remote user, the host application 3312 may provide user data which is transmitted using the OTT connection 3350.

The communication system 3300 further includes a base station 3320 provided in a telecommunication system and comprising hardware 3325 enabling it to communicate with the host computer 3310 and with the UE 3330. The hardware 3325 may include a communication interface 3326 for setting up and maintaining a wired or wireless connection with an interface of a different communication device of the communication system 3300, as well as a radio interface 3327 for setting up and maintaining at least a wireless connection 3370 with a UE 3330 located in a coverage area (not shown in FIG. 11) served by the base station 3320. The communication interface 3326 may be configured to facilitate a connection 3360 to the host computer 3310. The connection 3360 may be direct or it may pass through a core network (not shown in FIG. 11) of the telecommunication system and/or through one or more intermediate networks outside the telecommunication system. In the embodiment shown, the hardware 3325 of the base station 3320 further includes processing circuitry 3328, which may comprise one or more programmable processors, application-specific integrated circuits, field programmable gate arrays or combinations of these (not shown) adapted to execute instructions. The base station 3320 further has software 3321 stored internally or accessible via an external connection.

The communication system 3300 further includes the UE 3330 already referred to. Its hardware 3335 may include a radio interface 3337 configured to set up and maintain a wireless connection 3370 with a base station serving a coverage area in which the UE 3330 is currently located. The hardware 3335 of the UE 3330 further includes processing circuitry 3338, which may comprise one or more programmable processors, application-specific integrated circuits, field programmable gate arrays or combinations of these (not shown) adapted to execute instructions. The UE 3330 further comprises software 3331, which is stored in or accessible by the UE 3330 and executable by the processing circuitry 3338. The software 3331 includes a client application 3332. The client application 3332 may be operable to provide a service to a human or non-human user via the UE 3330, with the support of the host computer 3310. In the host computer 3310, an executing host application 3312 may communicate with the executing client application 3332 via the OTT connection 3350 terminating at the UE 3330 and the host computer 3310. In providing the service to the user, the client application 3332 may receive request data from the host application 3312 and provide user data in response to the request data. The OTT connection 3350 may transfer both the request data and the user data. The client application 3332 may interact with the user to generate the user data that it provides.

Figure 11:
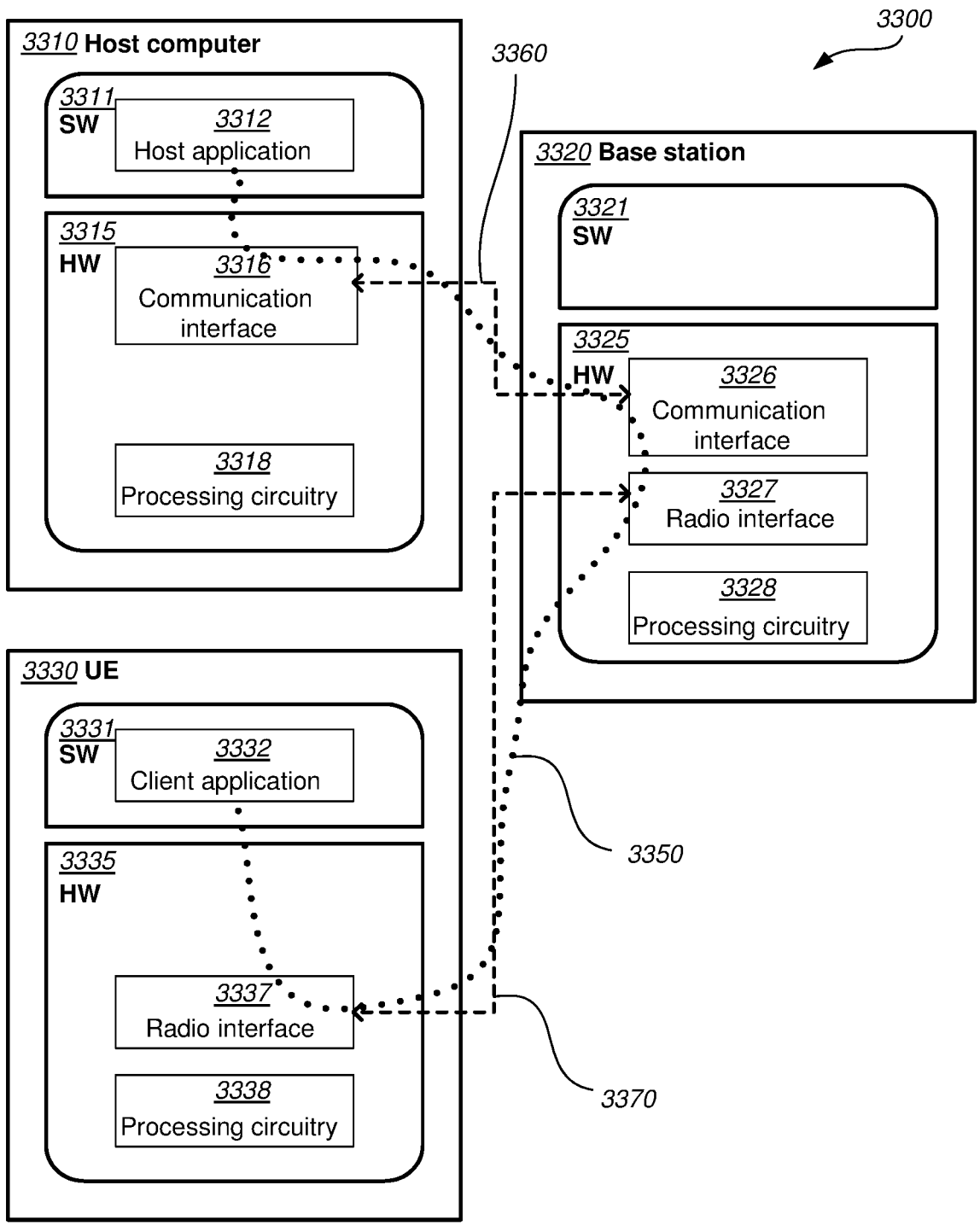

It is noted that the host computer 3310, base station 3320 and UE 3330 illustrated in FIG. 11 may be identical to the host computer 3230, one of the base stations 3212a, 3212b, 3212c and one of the UEs 3291, 3292 of FIG. 10, respectively. This is to say, the inner workings of these entities may be as shown in FIG. 11 and independently, the surrounding network topology may be that of FIG. 10.

In FIG. 11, the OTT connection 3350 has been drawn abstractly to illustrate the communication between the host computer 3310 and the use equipment 3330 via the base station 3320, without explicit reference to any intermediary devices and the precise routing of messages via these devices. Network infrastructure may determine the routing, which it may be configured to hide from the UE 3330 or from the service provider operating the host computer 3310, or both. While the OTT connection 3350 is active, the network infrastructure may further take decisions by which it dynamically changes the routing (e.g., on the basis of load balancing consideration or reconfiguration of the network).

The wireless connection 3370 between the UE 3330 and the base station 3320 is in accordance with the teachings of the embodiments described throughout this disclosure. One or more of the various embodiments improve the performance of OTT services provided to the UE 3330 using the OTT connection 3350, in which the wireless connection 3370 forms the last segment.

A measurement procedure may be provided for the purpose of monitoring data rate, latency and other factors on which the one or more embodiments improve. There may further be an optional network functionality for reconfiguring the OTT connection 3350 between the host computer 3310 and UE 3330, in response to variations in the measurement results. The measurement procedure and/or the network functionality for reconfiguring the OTT connection 3350 may be implemented in the software 3311 of the host computer 3310 or in the software 3331 of the UE 3330, or both. In embodiments, sensors (not shown) may be deployed in or in association with communication devices through which the OTT connection 3350 passes; the sensors may participate in the measurement procedure by supplying values of the monitored quantities exemplified above, or supplying values of other physical quantities from which software 3311, 3331 may compute or estimate the monitored quantities. The reconfiguring of the OTT connection 3350 may include message format, retransmission settings, preferred routing etc.; the reconfiguring need not affect the base station 3320, and it may be unknown or imperceptible to the base station 3320. Such procedures and functionalities may be known and practiced in the art. In certain embodiments, measurements may involve proprietary UE signaling facilitating the host computer's 3310 measurements of throughput, propagation times, latency and the like. The measurements may be implemented in that the software 3311, 3331 causes messages to be transmitted, in particular empty or 'dummy' messages, using the OTT connection 3350 while it monitors propagation times, errors etc.

Figure 12:
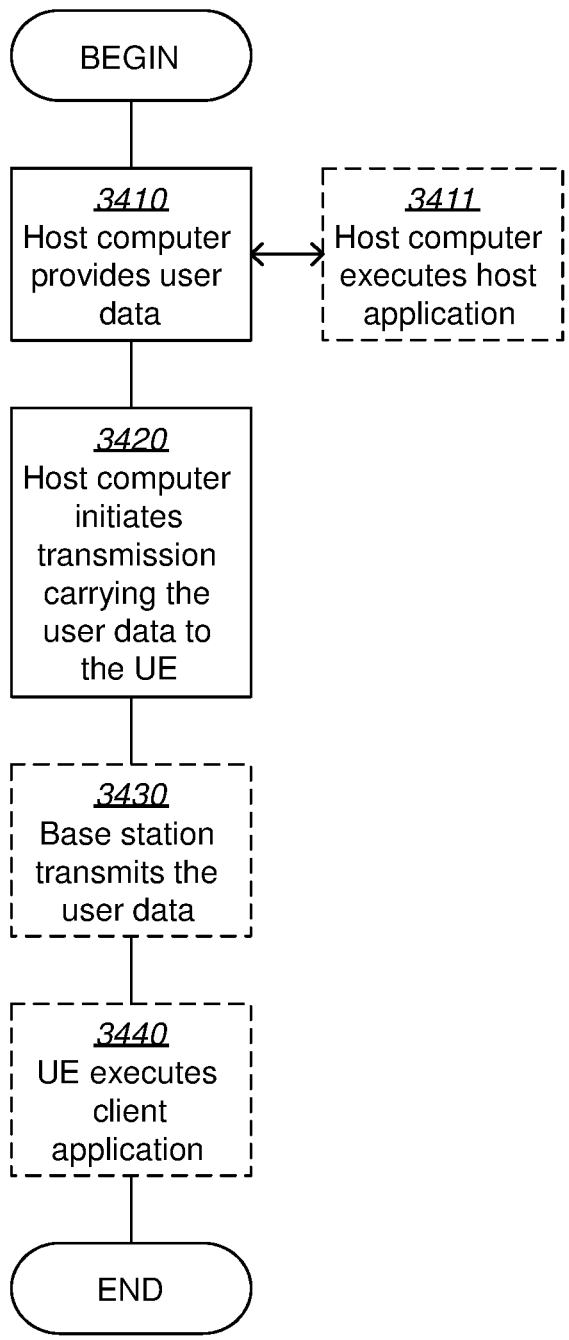

FIG. 12 is a flowchart illustrating a method implemented in a communication system, in accordance with one embodiment. The communication system includes a host computer, a base station such as a AP STA, and a UE such as a Non-AP STA which may be those described with reference to FIGS. 10 and 11. For simplicity of the present disclosure, only drawing references to FIG. 12 will be included in this section. In a first action 3410 of the method, the host computer provides user data. In an optional subaction 3411 of the first action 3410, the host computer provides the user data by executing a host application. In a second action 3420, the host computer initiates a transmission carrying the user data to the UE. In an optional third action 3430, the base station transmits to the UE the user data which was carried in the transmission that the host computer initiated, in accordance with the teachings of the embodiments described throughout this disclosure. In an optional fourth action 3440, the UE executes a client application associated with the host application executed by the host computer.

Figure 13:
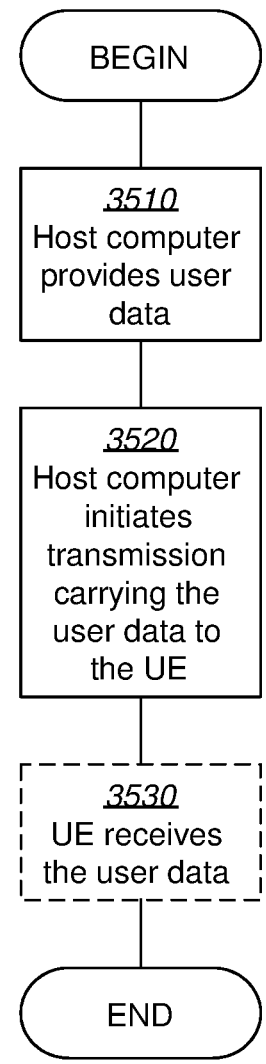

FIG. 13 is a flowchart illustrating a method implemented in a communication system, in accordance with one embodiment. The communication system includes a host computer, a base station such as a AP STA, and a UE such as a Non-AP STA which may be those described with reference to FIGS. 10 and 11. For simplicity of the present disclosure, only drawing references to FIG. 13 will be included in this section. In a first action 3510 of the method, the host computer provides user data. In an optional subaction (not shown) the host computer provides the user data by executing a host application. In a second action 3520, the host computer initiates a transmission carrying the user data to the UE. The transmission may pass via the base station, in accordance with the teachings of the embodiments described throughout this disclosure. In an optional third action 3530, the UE receives the user data carried in the transmission.

FIG. 14 is a flowchart illustrating a method implemented in a communication system, in accordance with one embodiment. The communication system includes a host computer, a base station such as a AP STA, and a UE such as a Non-AP STA which may be those described with reference to FIGS. 10 and 11. For simplicity of the present disclosure, only drawing references to FIG. 14 will be included in this section. In an optional first action 3610 of the method, the UE receives input data provided by the host computer. Additionally or alternatively, in an optional second action 3620, the UE provides user data. In an optional subaction 3621 of the second action 3620, the UE provides the user data by executing a client application. In a further optional subaction 3611 of the first action 3610, the UE executes a client application which provides the user data in reaction to the received input data provided by the host computer. In providing the user data, the executed client application may further consider user input received from the user. Regardless of the specific manner in which the user data was provided, the UE initiates, in an optional third subaction 3630, transmission of the user data to the host computer. In a fourth action 3640 of the method, the host computer receives the user data transmitted from the UE, in accordance with the teachings of the embodiments described throughout this disclosure.

FIG. 15 is a flowchart illustrating a method implemented in a communication system, in accordance with one embodiment. The communication system includes a host computer, a base station such as a AP STA, and a UE such as a Non-AP STA which may be those described with reference to FIGS. 10 and 11. For simplicity of the present disclosure, only drawing references to FIG. 15 will be included in this section. In an optional first action 3710 of the method, in accordance with the teachings of the embodiments described throughout this disclosure, the base station receives user data from the UE. In an optional second action 3720, the base station initiates transmission of the received user data to the host computer. In a third action 3730, the host computer receives the user data carried in the transmission initiated by the base station.

When using the word "comprise" or "comprising" it shall be interpreted as non-limiting, i.e. meaning "consist at least of".

The embodiments herein are not limited to the above described preferred embodiments. Various alternatives, modifications and equivalents may be used.

ABBREVIATION EXPLANATION

E-SMLC Evolved-Serving Mobile Location Centre
GNSS Global Navigation System
RTK Real Time Kinematic
RMS Root Mean Square

The invention claimed is:
1. A method performed by a wireless device for performing measurements associated to estimating a position of the wireless device, the method comprising:
  performing a code phase measurement on a satellite signal received by the wireless device, wherein the code phase measurement indicates a first number of cycles of a code of the satellite signal, the first number comprising a first integer part and a first fractional part;
  performing a carrier phase measurement on the satellite signal, wherein:
    the carrier phase measurement indicates a second number of cycles of a carrier frequency of the satellite signal, and the second number corresponds to the first fractional part of the first number of cycles of the code of the satellite signal; and sending to a location server a report comprising the code phase measurement and the carrier phase measurement.

2. The method according to claim 1, wherein the report comprises at least one of the following:
   a second number of cycles of a carrier phase, the second number comprising a second integer part and a second fractional part;
   a Root Mean Square (RMS) error to indicate uncertainty of the carrier phase measurement;
   a measurement of a Doppler shift of the satellite signal; and
   a carrier phase sign indicator indicating a direction from a previous carrier phase measurement.

3. The method according to claim 1, further comprising providing to the location server at least one of the following:
   a code phase measurement capability of the wireless device; and
   a carrier phase measurement capability of the wireless device.

4. The method according to claim 1, wherein the method further comprises:
   determining a resolution for the code phase measurement based on a desired resolution received from the location server, wherein the resolution indicates a time duration of one cycle of the code phase; and
   performing the code phase measurement based on the determined resolution.

5. The method according to claim 4, wherein the report further comprises the determined resolution for the code phase measurement.

6. The method according to claim 1, further comprising determining the second integer part based on a desired integer received from the location server.

7. A non-transitory, computer-readable storage medium having stored thereon computer-executable instructions that, when executed by processing circuitry comprising a wireless device, configure the wireless device to perform operations corresponding to the method of claim 1.

8. A method performed by a location server for estimating a position of a wireless device, the method comprising:
   receiving from the wireless device a report comprising a code phase measurement and a carrier phase measurement, wherein:
      the code phase measurement indicates a first number of cycles of a code of a satellite signal received by the wireless device, the first number comprising a first integer part and a first fractional part;
      the carrier phase measurement indicates a second number of cycles of a carrier frequency of the satellite signal; and
      the second number corresponds to the first fractional part of the first number of cycles of the code of the satellite signal; and
   estimating the position of the wireless device based on the report.

9. The method according to claim 8, wherein the report comprises at least one of the following:
   a second number of cycles of a carrier phase, the second number comprising a second integer part and a second fractional part;
   a Root Mean Square (RMS) error to indicate uncertainty of the carrier phase measurement;
   a measurement of a Doppler shift of the satellite signal; and
   a carrier phase sign indicator indicating a direction from a previous carrier phase measurement.

10. The method according to claim 8, further comprising receiving from the wireless device at least one of the following:
    a code phase measurement capability of the wireless device; and
    a carrier phase measurement capability of the wireless device.

11. The method according to claim 8, further comprising sending to the wireless device at least one of the following:
    a desired resolution for the code phase measurement; and
    a desired integer part of cycles of a carrier phase of the satellite signal.

12. The method according to claim 11, wherein the report further comprises a resolution for the code phase measurement received in the report.

13. A non-transitory, computer-readable storage medium having stored thereon computer-executable instructions that, when executed by processing circuitry comprising a location server, configure the location server to perform operations corresponding to the method of claim 8.

14. A wireless device comprising processing circuitry configured to:
    perform a code phase measurement on a satellite signal received by the wireless device, wherein the code phase measurement indicates a first number of cycles of a code of the satellite signal, the first number comprising a first integer part and a first fractional part;
    perform a carrier phase measurement on the satellite signal, wherein:
       the carrier phase measurement indicates a second number of cycles of a carrier frequency of the satellite signal, and
       the second number corresponds to the first fractional part of the first number of cycles of the code of the satellite signal; and
    send, to a location server, a report comprising the code phase measurement and the carrier phase measurement.

15. The wireless device according to claim 14, wherein the report comprises at least one of the following:
    a second number of cycles of a carrier phase, the second number comprising a second integer part and a second fractional part;
    a Root Mean Square (RMS) error to indicate uncertainty of the carrier phase measurement;
    a measurement of a Doppler shift of the satellite signal; and
    a carrier phase sign indicator indicating a direction from a previous carrier phase measurement.

16. The wireless device according to claim 14, wherein the processing circuitry is further configured to send, to the location server, at least one of the following:
    a code phase measurement capability of the wireless device; and
    a carrier phase measurement capability of the wireless device.

17. The wireless device according to claim 14, wherein the processing circuitry is further configured to:
    determine a resolution for the code phase measurement based on a desired resolution received from the location server, wherein the resolution indicates a time duration of one cycle of the code phase; and
    perform the code phase measurement based on the determined resolution.

18. The wireless device according to claim 17, wherein the report further comprises the determined resolution for the code phase measurement.

19. The wireless device according to claim 14, wherein the processing circuitry is further configured to determine the second integer part based on a desired integer part received from the location server.

20. A location server comprising processing circuitry configured to:
    receive, from a wireless device, a report comprising a code phase measurement and a carrier phase measurement; wherein:
        the code phase measurement indicates a first number of cycles of a code of a satellite signal received by the wireless device, the first number comprising a first integer part and a first fractional part;
        the carrier phase measurement indicates a second number of cycles of a carrier frequency of the satellite signal; and
        the second number corresponds to the first fractional part of the first number of cycles of the code of the satellite signal; and
    estimate the position of the wireless device based on the report.

21. The location server according to claim 20, wherein the report comprises at least one of the following:
    a second number of cycles of a carrier phase, the second number comprising a second integer part and a second fractional part;
    a Root Mean Square (RMS) error to indicate uncertainty of the carrier phase measurement;
    a measurement of a Doppler shift of the satellite signal; and
    a carrier phase sign indicator indicating a direction from a previous carrier phase measurement.

22. The location server according to claim 20, wherein the processing circuitry is further configured to receive at least one of the following:
    a code phase measurement capability of the wireless device; and
    a carrier phase measurement capability of the wireless device.

23. The location server according to claim 20, wherein the processing circuitry is further configured to send to the wireless device at least one of the following:
    a desired resolution for the code phase measurement; and
    a desired integer part of cycles of a carrier phase of the satellite signal.

24. The location server according to claim 23, wherein the report further comprises a resolution for the code phase measurement determined by the wireless device.

* * * * *